(12) United States Patent
Jiang et al.

(10) Patent No.: US 10,068,914 B2
(45) Date of Patent: Sep. 4, 2018

(54) SEMICONDUCTOR STRUCTURE AND MANUFACTURING METHOD OF THE SAME

(71) Applicant: MACRONIX INTERNATIONAL CO., LTD., Hsinchu (TW)

(72) Inventors: Yu-Wei Jiang, Hsinchu (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 125 days.

(21) Appl. No.: 14/689,115

(22) Filed: Apr. 17, 2015

(65) Prior Publication Data

US 2016/0307913 A1    Oct. 20, 2016

(51) Int. Cl.
*H01L 27/11582* (2017.01)
*H01L 27/11565* (2017.01)

(52) U.S. Cl.
CPC .. *H01L 27/11582* (2013.01); *H01L 27/11565* (2013.01)

(58) Field of Classification Search
CPC ......... H01L 27/11504; H01L 27/11519; H01L 27/11565; H01L 27/11587; H01L 27/11556; H01L 27/11582
See application file for complete search history.

(56) References Cited

U.S. PATENT DOCUMENTS

| | | | | |
|---|---|---|---|---|
| 9,230,987 | B2 * | 1/2016 | Pachamuthu | H01L 27/11582 |
| 9,305,849 | B1 * | 4/2016 | Tsutsumi | H01L 21/28282 |
| 9,455,263 | B2 * | 9/2016 | Zhang | H01L 27/11529 |
| 9,793,288 | B2 * | 10/2017 | Yada | H01L 27/11582 |
| 9,842,851 | B2 * | 12/2017 | Pachamuthu | H01L 27/11582 |
| 2007/0158736 | A1 * | 7/2007 | Arai | H01L 27/105 257/315 |
| 2007/0252201 | A1 * | 11/2007 | Kito | H01L 21/8221 257/331 |
| 2009/0296476 | A1 * | 12/2009 | Shin | G11C 5/02 365/185.17 |

(Continued)

FOREIGN PATENT DOCUMENTS

CN         1375877 A       10/2002

OTHER PUBLICATIONS

CN Office Action dated Apr. 2, 2018 in Chinese application (No. 201510196461.5).

*Primary Examiner* — Joshua King
(74) *Attorney, Agent, or Firm* — McClure, Qualey & Rodack, LLP

(57) ABSTRACT

A semiconductor structure and a manufacturing method of the same are provided. The semiconductor structure includes a substrate, a plurality of conductive layers, a plurality of insulating layers, a first vertical memory structure, a second vertical memory structure, and an isolation trench. The conductive layers and the insulating layers are interlaced and stacked on the substrate. The first vertical memory structure and the second memory structure penetrate the conductive layers and the insulating layers are formed on the substrate. The first vertical memory structure has a first horizontal C shaped cross-section, and the second vertical memory structure has a second horizontal C shaped cross-section. The isolation trench is formed between the first vertical memory structure and the second vertical memory structure.

16 Claims, 26 Drawing Sheets

(56) References Cited

U.S. PATENT DOCUMENTS

| | | | |
|---|---|---|---|
| 2010/0207194 A1* | 8/2010 | Tanaka | H01L 27/11578 257/324 |
| 2012/0012921 A1* | 1/2012 | Liu | H01L 27/11565 257/326 |
| 2012/0098139 A1* | 4/2012 | Chae | H01L 29/7926 257/773 |
| 2012/0273872 A1 | 11/2012 | Lim et al. | |
| 2012/0326221 A1* | 12/2012 | Sinha | H01L 21/31111 257/315 |
| 2013/0056820 A1* | 3/2013 | Jeong | H01L 27/0688 257/324 |
| 2014/0035026 A1* | 2/2014 | Jang | H01L 29/792 257/324 |
| 2014/0070302 A1* | 3/2014 | Yoo | H01L 27/1157 257/324 |
| 2015/0076586 A1* | 3/2015 | Rabkin | G11C 16/0483 257/324 |
| 2015/0115348 A1* | 4/2015 | Nam | H01L 27/11582 257/324 |
| 2015/0194435 A1* | 7/2015 | Lee | H01L 27/11575 257/329 |
| 2015/0262932 A1* | 9/2015 | Yamane | H01L 27/11582 257/314 |
| 2016/0071876 A1* | 3/2016 | Mizuno | H01L 27/11582 365/185.17 |
| 2016/0099254 A1* | 4/2016 | Park | H01L 27/11582 257/324 |

\* cited by examiner

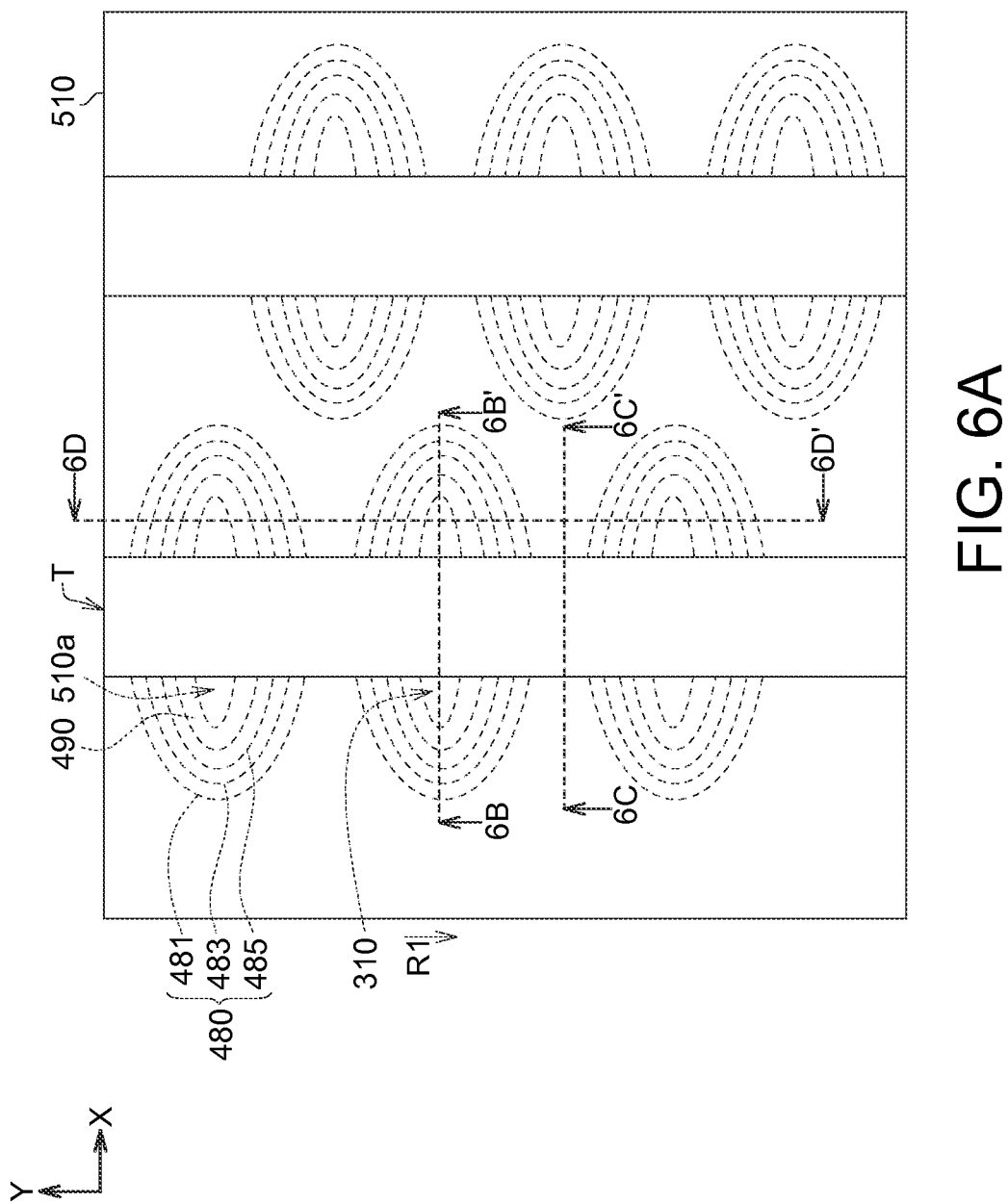

SEMICONDUCTOR STRUCTURE AND MANUFACTURING METHOD OF THE SAME

BACKGROUND

Technical Field

The disclosure relates in general to a semiconductor structure and a manufacturing method thereof, and particularly to a semiconductor structure with a high memory density and a manufacturing method thereof.

Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof are in need.

As such, it is desirable to develop a three-dimensional (3D) memory device with larger number of multiple stacked planes to achieve greater storage capacity, improved qualities, and yet remaining a small size.

SUMMARY

The disclosure relates in general to a semiconductor structure and a manufacturing method thereof. In the semiconductor structure of the embodiments, a pair of vertical memory structures both have horizontal C shaped cross-sections and are separated from each other by an isolation trench; accordingly, the memory density in a unit area in increased, and hence a greater memory storage capacity is achieved.

According to an embodiment of the disclosure, a semiconductor structure is provided. The semiconductor structure includes a substrate, a plurality of conductive layers, a plurality of insulating layers, a first vertical memory structure, a second vertical memory structure, and an isolation trench. The conductive layers and the insulating layers are interlaced and stacked on the substrate. The first vertical memory structure and the second memory structure penetrating the conductive layers and the insulating layers are formed on the substrate. The first vertical memory structure has a first horizontal C shaped cross-section, and the second vertical memory structure has a second horizontal C shaped cross-section. The isolation trench is formed between the first vertical memory structure and the second vertical memory structure.

According to another embodiment of the disclosure, a manufacturing method of a semiconductor structure is provided. The manufacturing method of the semiconductor structure includes the following steps. A substrate is provided. A plurality of conductive layers and a plurality of insulating layers are formed on the substrate, wherein the conductive layers and the insulating layers are interlaced and stacked on the substrate. A first vertical memory structure and a second vertical memory structure are formed on the substrate, wherein the first vertical memory structure and the second vertical memory structure penetrate the conductive layers and the insulating layers, the first vertical memory structure has a first horizontal C shaped cross-section, and the second vertical memory structure has a second horizontal C shaped cross-section. An isolation trench is formed on the substrate and located between the first vertical memory structure and the second vertical memory structure.

The above and other aspects of the disclosure will become better understood with regard to the following detailed description of the non-limiting embodiment(s). The following description is made with reference to the accompanying drawings.

DETAILED DESCRIPTION

Figure 1A:
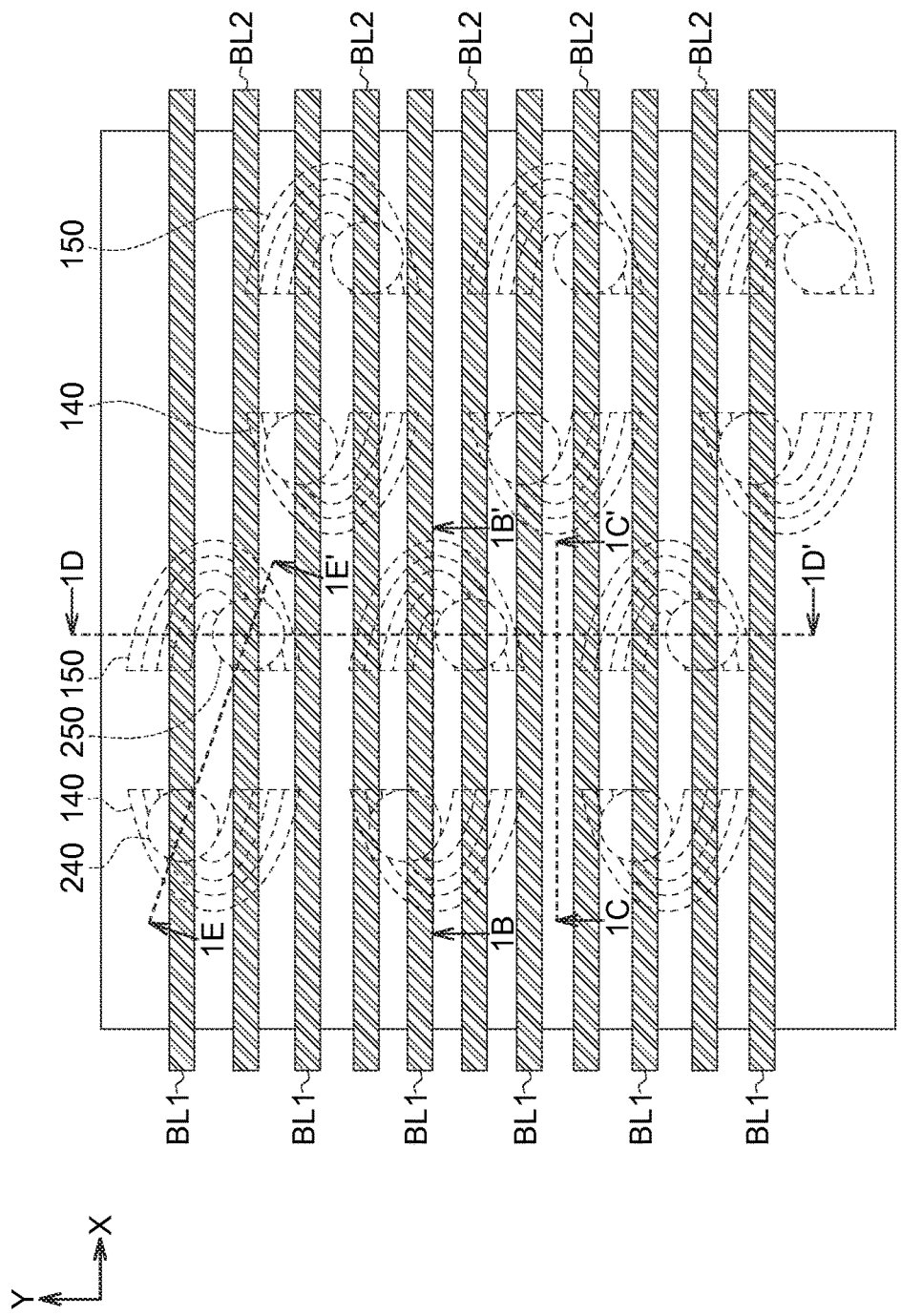
FIG. 1A shows a top view of a semiconductor structure according to an embodiment of the present disclosure.

In the embodiments of the present disclosure, a semiconductor structure and a method of manufacturing the same are provided. In the semiconductor structure of the embodiments, a pair of vertical memory structures both have horizontal C shaped cross-sections and are separated from each other by an isolation trench; accordingly, the memory density in a unit area in increased, and hence a greater memory storage capacity is achieved. The following embodiments are for the purpose of elaboration only, not for limiting the scope of protection of the invention. Besides, some of the secondary elements are omitted in the drawings accompanying the following embodiments to highlight the technical features of the invention.

Figure 1B:
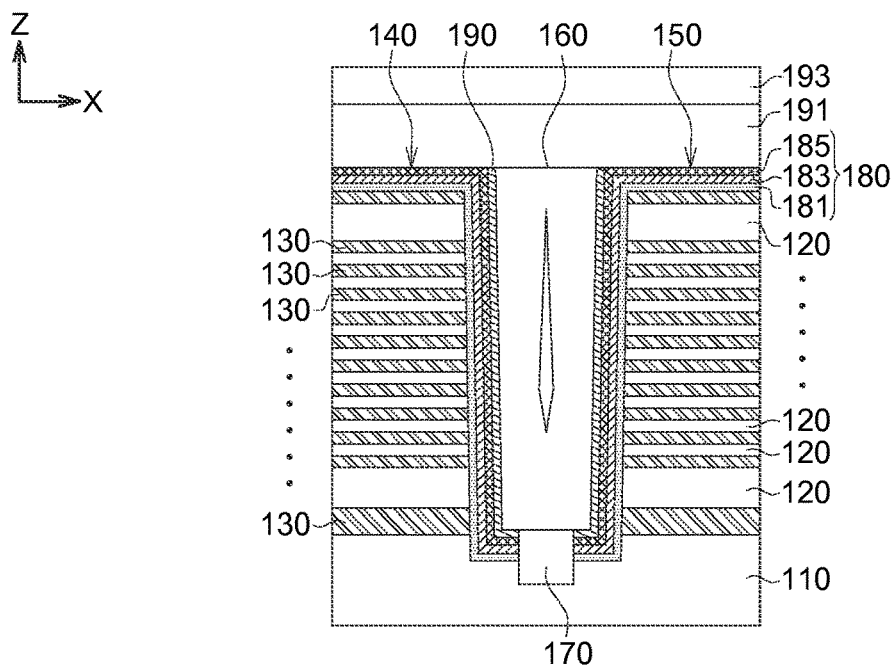
FIG. 1B is a cross-sectional view along the cross-sectional line 1B-1B' in FIG. 1A.
Figure 1C:
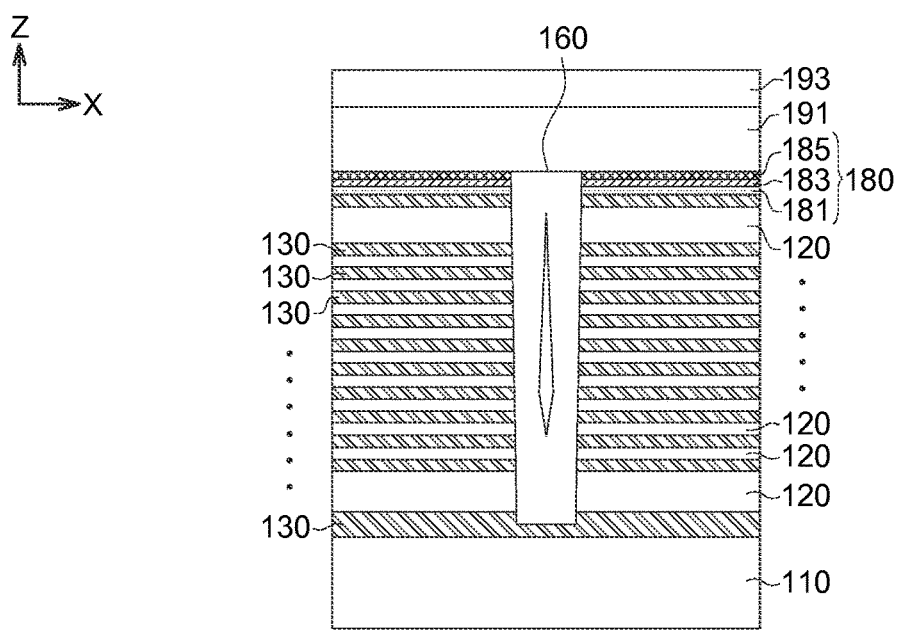
FIG. 1C is a cross-sectional view along the cross-sectional line 1C-1C' in FIG. 1A.
Figure 1D:
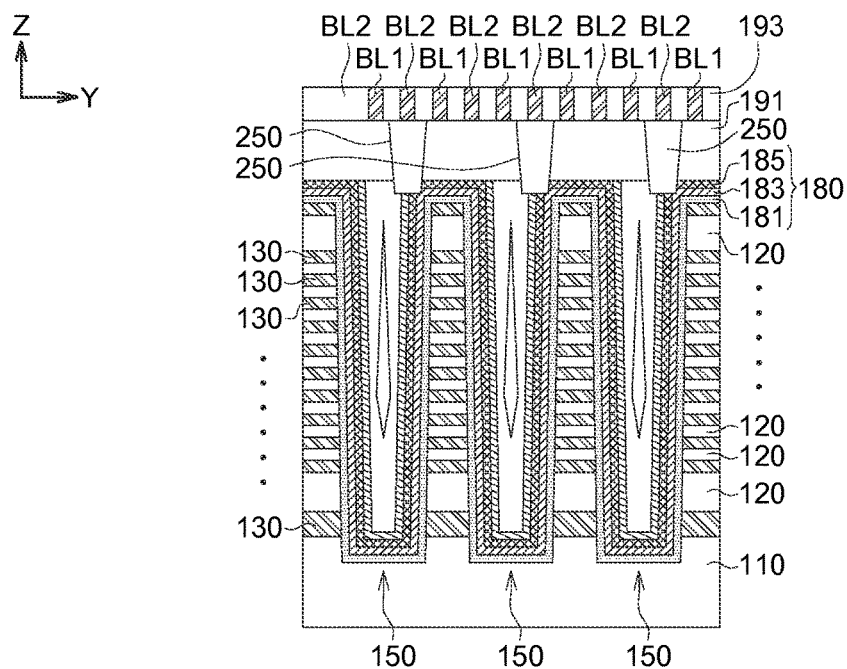
FIG. 1D is a cross-sectional view along the cross-sectional line 1D-1D' in FIG. 1A.
Figure 1E:
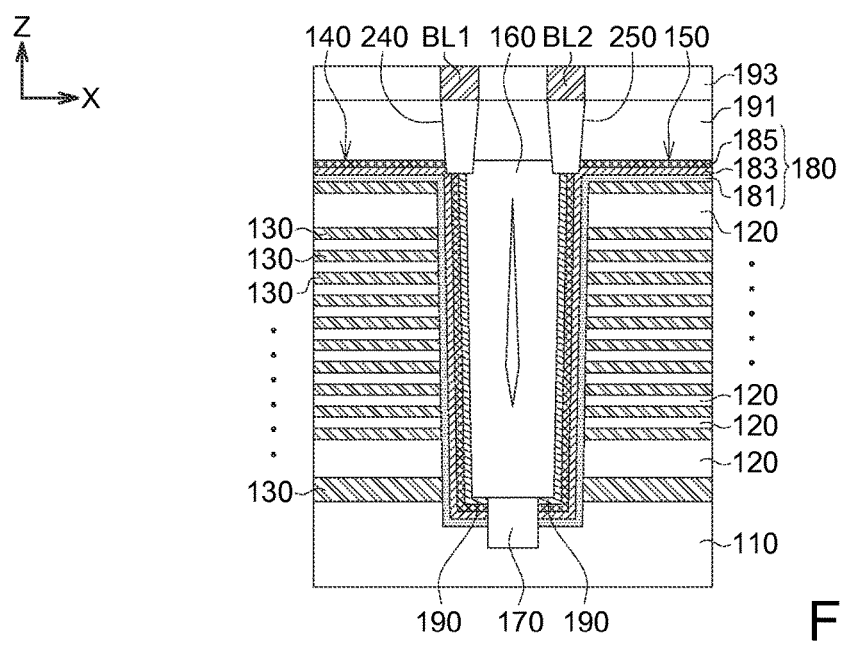
FIG. 1E is a cross-sectional view along the cross-sectional line 1E-1E' in FIG. 1A.

FIG. 1A shows a top view of a semiconductor structure 100 according to an embodiment of the present disclosure, FIG. 1B is a cross-sectional view along the cross-sectional line 1B-1B' in FIG. 1A, FIG. 1C is a cross-sectional view along the cross-sectional line 1C-1C' in FIG. 1A, FIG. 1D is a cross-sectional view along the cross-sectional line 1D-1D' in FIG. 1A, and FIG. 1E is a cross-sectional view along the cross-sectional line 1E-1E' in FIG. 1A. In the embodiments, the semiconductor structure 100 is such as the main structure of a three-dimensional (3D) memory device.

As shown in FIGS. 1A-1E, the semiconductor structure 100 includes a substrate 110, a plurality of conductive layers 120, a plurality of insulating layers 130, a first vertical memory structure 140, a second vertical memory structure 150, and an isolation trench 160. The conductive layers 120 and the isolating layers 130 are formed on the substrate 110. The conductive layers 120 and the insulating layers 130 are interlaced and stacked on the substrate 110. The first vertical memory structure 140 and a second vertical memory structure 150 penetrate the conductive layers 120 and the insulating layers 130 and are formed on the substrate 110. As shown in FIG. 1A, the first vertical memory structure 140 has a first horizontal C shaped cross-section, and the second vertical memory structure 150 has a second horizontal C shaped cross-section. As shown in FIGS. 1B and 1E, the isolation trench 160 is formed on the substrate 110 and located between the first vertical memory structure 140 and the second vertical memory structure 150.

In the embodiments, while the semiconductor structure 100 is used in a 3D memory device, the substrate 110 is such as a bottom source, the conductive layers 120 are such as word lines, the bottommost layer of the conductive layers 120 is such as a ground select line (GSL), the topmost layer of the conductive layers 120 is such as a string select line (SSL), the first vertical memory structure 140 and the second vertical memory structure 150 are such as memory strings, and the 3D memory device is such as a vertical channel type memory device.

In the embodiments, in the semiconductor structure 100, a pair of the vertical memory structures both have horizontal C shaped cross-sections and are separated from each other by the isolation trench 160; accordingly, the memory density in a unit area in increased, and hence a greater memory storage capacity is achieved. In the embodiment, the bilaterally symmetrically arranged first vertical memory structure 140 and second vertical memory structure 150 respectively connect to different bit lines; as such, the memory density is increased, and different program/erase operations can be processed simultaneously since different vertical memory structures (memory strings) can be selected via different bit lines simultaneously, and thus the processing speed can be further increased.

As shown in FIGS. 1B and 1E, the semiconductor structure 100 may further include an epitaxial structure 170. The epitaxial structure 170 is formed between the isolation trench 160 and the substrate 110. The first vertical memory structure 140 and the second vertical memory structure 150 are electrically connected to the substrate 110 via the epitaxial structure 170.

As shown in FIGS. 1B and 1D-1E, the first vertical memory structure 140 and the second vertical memory structure 150 respectively include a memory structure layer 180 and a channel layer 190 formed on the memory structure layer 180.

In the embodiment, the memory structure layer 180 includes a blocking layer 181, a memory storage layer 183, and a tunneling layer 185. The blocking layer 181 is formed on the conductive layers 120, the memory storage layer 183 is formed on the blocking layer 181, and the tunneling layer 185 is formed on the memory storage layer 183. In the embodiment, the blocking layer 181 and the tunneling layer 185 are such as silicon oxide layers, the memory storage layer 183 is such as a silicon nitride layer, and the channel layer 190 is such as a polysilicon layer.

As shown in FIG. 1A, a pattern of the first horizontal C shaped cross-section of the first vertical memory structure 140 and a pattern of the second horizontal C shaped cross-section of the second vertical memory structure 150 are bilaterally symmetric with respect to the isolation trench 160. For example, the notch of the C shaped pattern of the first horizontal C shaped cross-section of the first vertical memory structure 140 and the notch of the C shaped pattern of the second horizontal C shaped cross-section of the second vertical memory structure 150 both face toward the isolation trench 160.

As shown in FIGS. 1B and 1E, the first vertical memory structure 140 and the second vertical memory structure 150 are in direct contact with the isolation trench 160.

As shown in FIGS. 1A and 1D-1E, the semiconductor structure 100 may further include a first contact structure 240 and a second contact structure 250. The first contact structure 240 is electrically connected to the first vertical memory structure 140, and the second contact structure 250 is electrically connected to the second contact memory structure 150. In the embodiment, the semiconductor structure 100 may further include an isolation layer 191. The isolation layer 191 is formed on the first vertical memory structure 140 and the second vertical memory structure 150, and the first contact structure 240 and the second contact structure 250 are formed in the isolation layer 191. The isolation layer 191 is such as an interlayer dielectric layer (ILD) formed of such as an oxide.

As shown in FIGS. 1A and 1D-1E, the semiconductor structure 100 may further include a first bit line BL1 and a second bit line BL2. The first bit line BL1 is electrically connected to the first contact structure 240, and the second bit line BL2 is electrically connected to the second contact structure 250. In the embodiment, the semiconductor structure 100 may further include an isolation layer 193. The isolation layer 193 is formed on the isolation layer 191, and the first bit line BL1 and the second bit line BL2 are formed in the isolation layer 193. The isolation layer 193 is such as an oxide layer.

Figure 2:
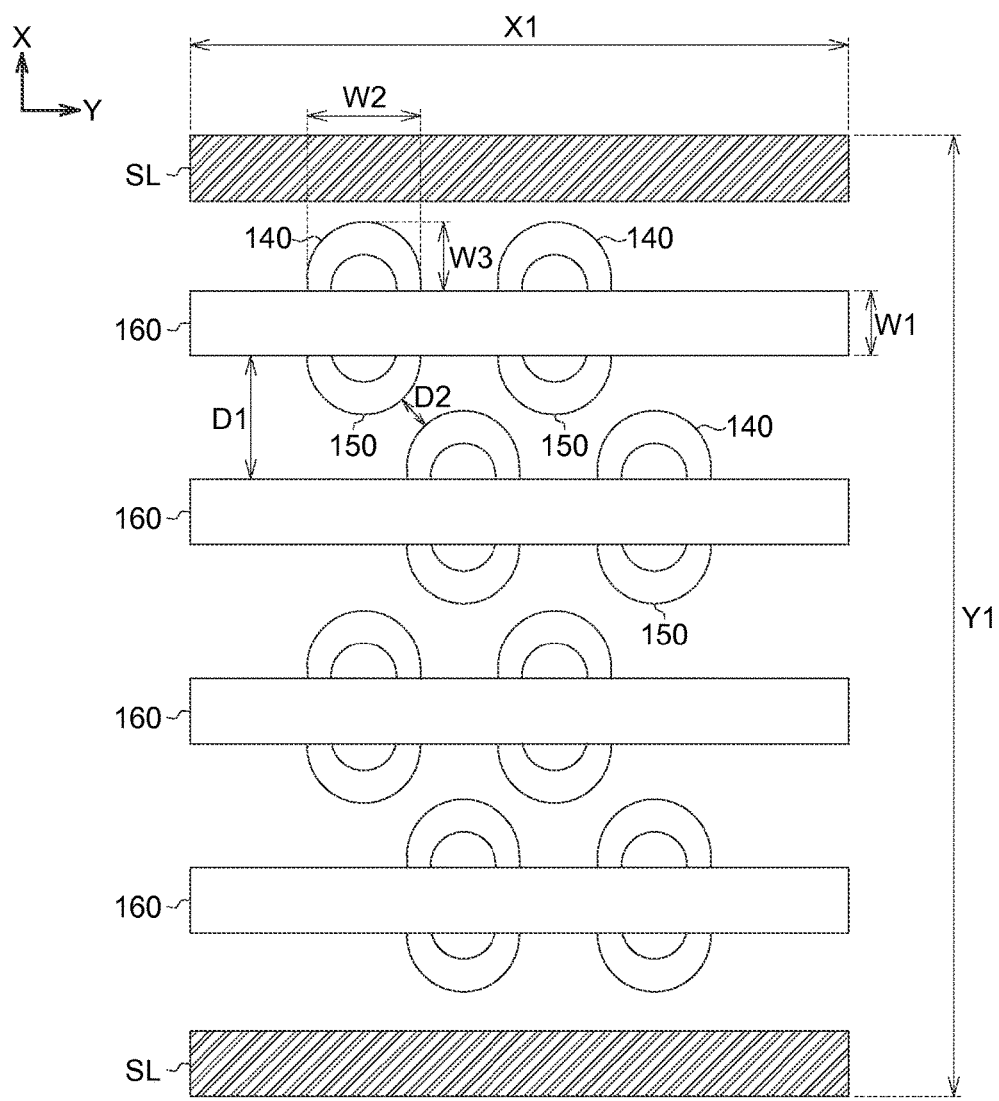
FIG. 2 shows a top view of the arrangement of the first vertical memory structures and the second vertical memory structures according to an embodiment of the present disclosure.

FIG. 2 shows a top view of the arrangement of the first vertical memory structures 140 and the second vertical memory structures 150 of the semiconductor structure 100 according to an embodiment of the present disclosure. In the drawings, some of the secondary elements are omitted and some of the elements are shown in a perspective manner to highlight the technical features of the invention.

As shown in FIG. 2, the first vertical memory structures 140 and the second vertical memory structures 150 are separated by the isolation trenches 160. In the embodiment, the width W1 of the isolation trench 160 is about 40-50 nm, and the first vertical memory structure 140 and the second vertical memory structure 150 are separated from each other by the width W1 of the isolation trench 160. In the embodiment, the distance D1 between the isolation trenches 160 is about 90 nm.

In the embodiment, the size of the first horizontal C shaped cross-section of the first vertical memory structure 140 and the size of the second horizontal C shaped cross-section of the second vertical memory structure 150 are about 50-80 nm. In the embodiment, the size of the first horizontal C shaped cross-section and the size of the second horizontal C shaped cross-section are substantially the same. For example, as shown in FIG. 2, the sizes and shapes of the first horizontal C shaped cross-sections and the second horizontal C shaped cross-sections are substantially the same. The maximum width W2 of each of the C shaped cross-sections is about 80 nm, and the minimum width W3 of each of the C shaped cross-sections is about 50 nm. Moreover, the distance D2 between a first vertical memory structure 140 and the adjacent second vertical memory structure 150 is such as about 30-40 nm.

In the embodiment, a memory array unit has a length Y1, which is along the Y direction and defined by adjacent local source lines SL, of about 560 nm and a width X1, which is along the X direction, of about 156 nm is taken as an example. According to the embodiments of the present disclosure, the memory array unit of such size can include 16 vertical memory structures (memory strings); that is a capacity of 92 memory strings in each area of 1 square micrometer. On the other hand, while cross-sections of memory string structures are concentric circles with a size of about 110 nm, such memory array unit having a length of about 480 nm along the Y direction and a width of about 160 nm along the X direction can only include 8 memory strings;

as such, a capacity of only 52 memory strings in each area of 1 square micrometer may be obtained. According to the above comparison, the memory density can be increased by about 1.8 times while the memory array unit is designed according to the embodiments of the present disclosure.

Moreover, compared to the memory string structure having cross-sections which are concentric circles with a size of about 110 nm, according to the embodiments of the present disclosure, the vertical memory structures have C shaped cross-sections with a size of about 50-80 nm, which have a relatively small curvatures; as such, field enhancement effects are better, and hence the performance of the whole device can be further improved.

Furthermore, as shown in FIG. 1A, the first contact structure 240 and the second contact structure 250 are not aligned with each other along the bit lines BL1/BL2 direction; on the contrary, the first contact structure 240 and the second contact structure 250 are staggered along the bit lines BL1/BL2 direction. In addition, the first vertical memory structures 140 and the second vertical memory structures 150 are arranged in a honeycomb-like arrangement, such that more bit lines can be connected from a unit area, and therefore the memory density can be effectively increased.

Referring to FIGS. 1A-1E and 3A-11B, a process for manufacturing a semiconductor structure 100 according to an embodiment of the present disclosure is illustrated.

Figure 3A:
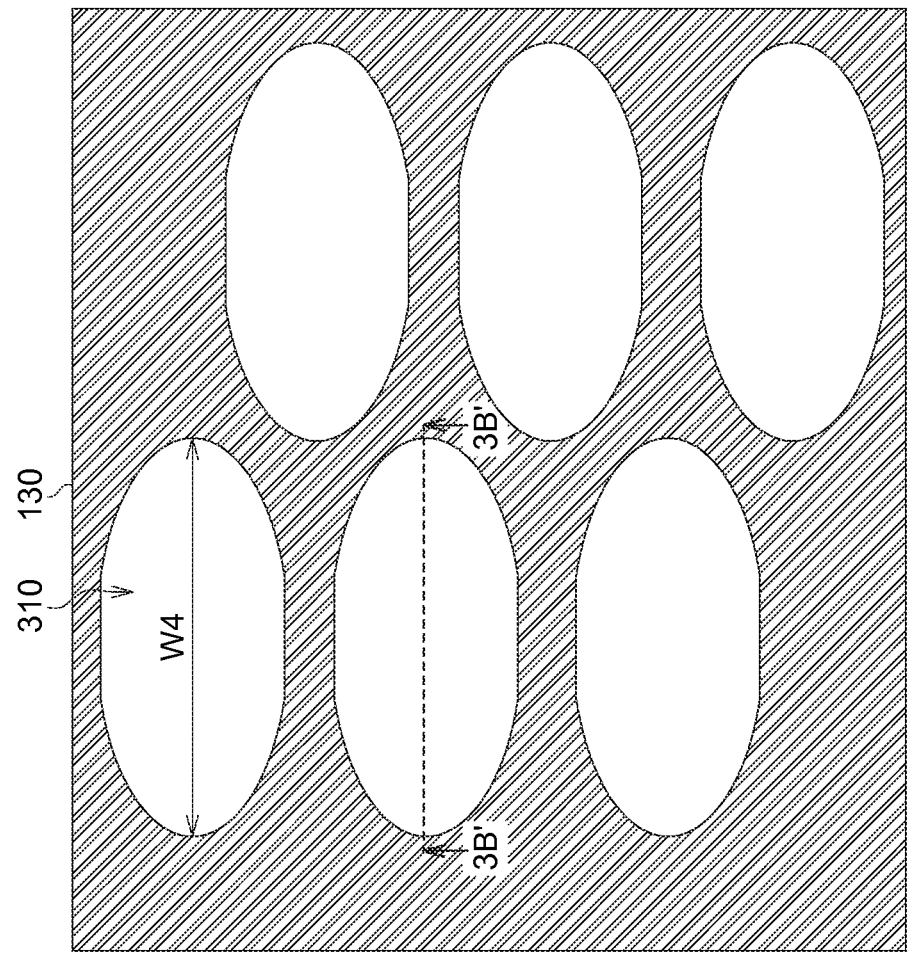
FIGS. 3A-11B illustrate a process for manufacturing a semiconductor structure according to an embodiment of the present disclosure.
Figure 3B:
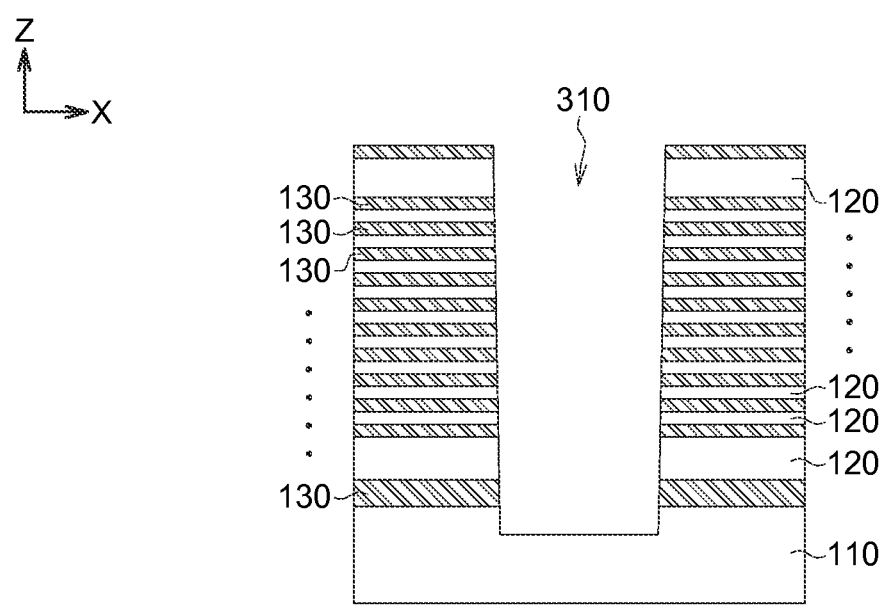

FIG. 3B is a cross-sectional view along the cross-sectional line 3B-3B' in FIG. 3A. As shown in FIGS. 3A-3B, the substrate 110 is provided, and the conductive layers 120 and the insulating layers 130 are formed on the substrate 110. The conductive layers 120 and the insulating layers 130 are interlaced and stacked on the substrate 110.

Next, the first vertical memory structure 140 and the second vertical memory structure 150 are formed on the substrate 110. The manufacturing method of the first vertical memory structure 140 and the second vertical memory structure 150 includes such as the following steps.

As shown in FIGS. 3A-3B, a recess 310 is formed, and the recess 310 penetrates the conductive layers 120 and the insulating layers 130 and stops on the substrate 110. As shown in FIG. 3A, the recess 310 has an elliptical cross-section, and the long axis (maximum diameter) W4 of the elliptical cross-section is such as about 150 nm.

Figure 4A:
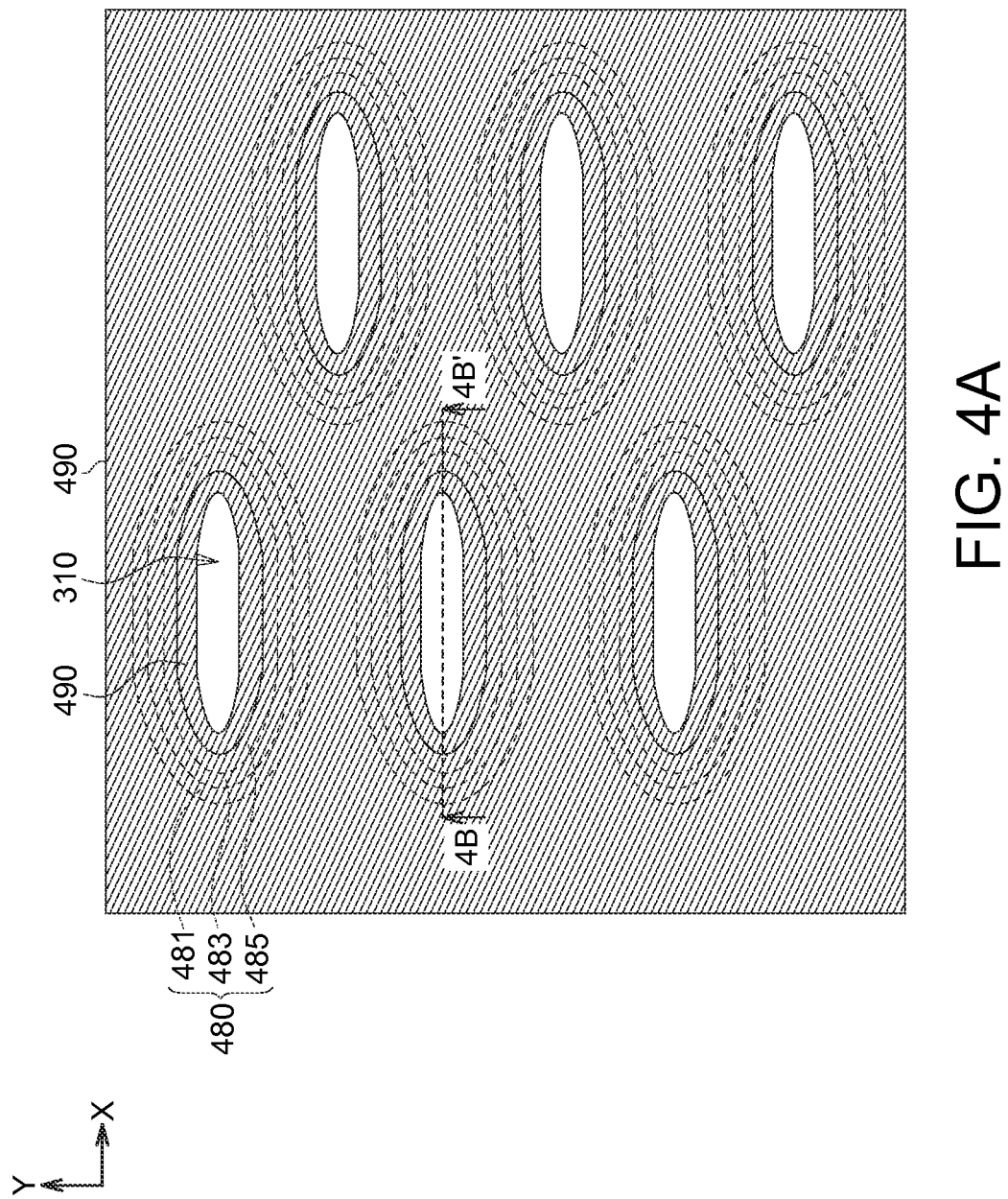
Figure 4B:
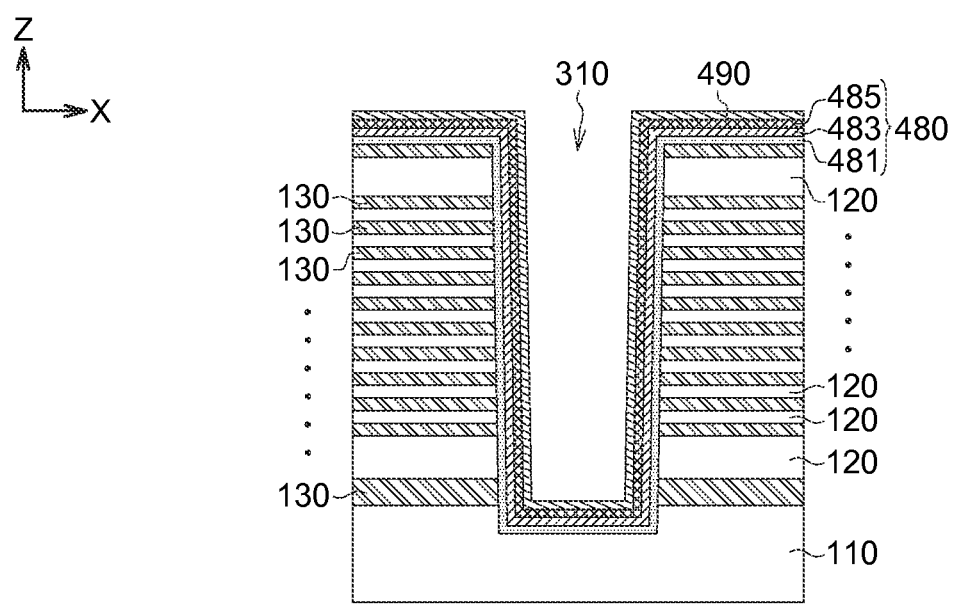

FIG. 4B is a cross-sectional view along the cross-sectional line 4B-4B' in FIG. 4A. As shown in FIGS. 4A-4B, a memory structure material layer 480 is formed in the recess 310, and a channel material layer 490 is formed on the memory structure material layer 480. The memory structure material layer 480 includes a blocking material layer 481, a memory storage material layer 483, and a tunneling material layer 485. The blocking material layer 481 is formed on the conductive layers 120, the memory storage material layer 483 is formed on the blocking material layer 481, and the tunneling material layer 485 is formed on the memory storage material layer 483. In the embodiment, the blocking material layer 481 and the tunneling material layer 485 are such as silicon oxide layers, the memory storage material layer 483 is such as a silicon nitride layer, and the channel material layer 490 is such as a polysilicon layer.

Figure 5A:
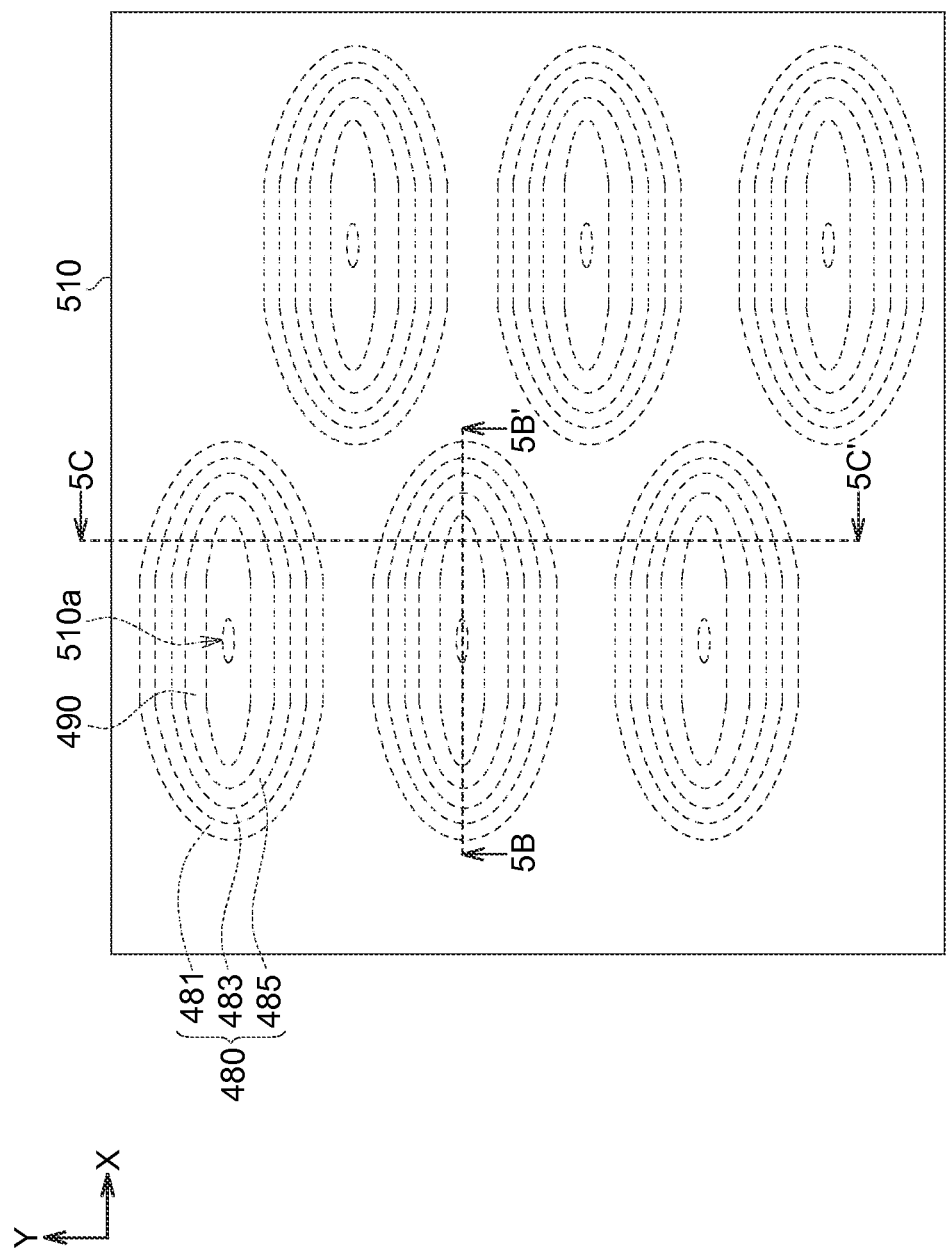
Figure 5B:
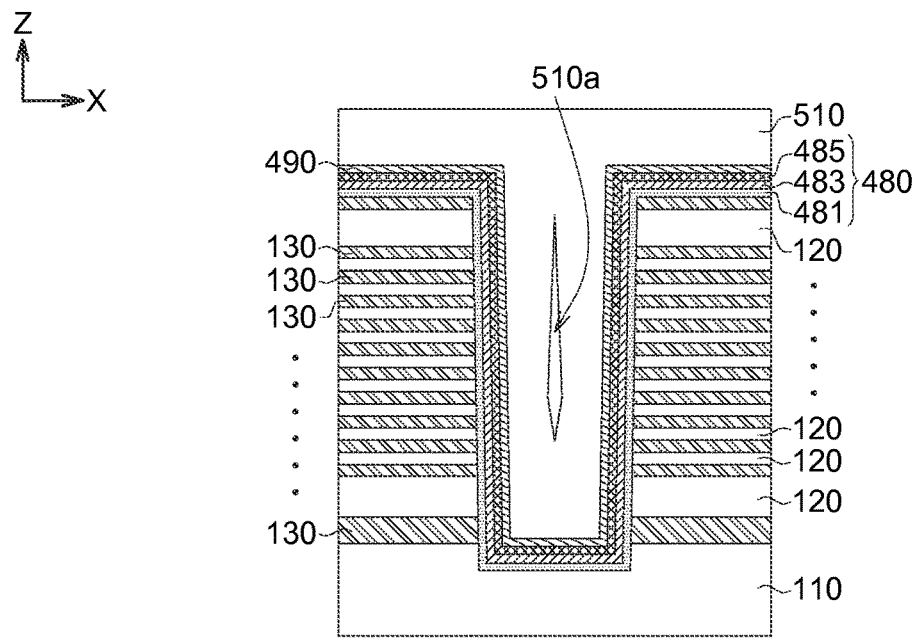
Figure 5C:
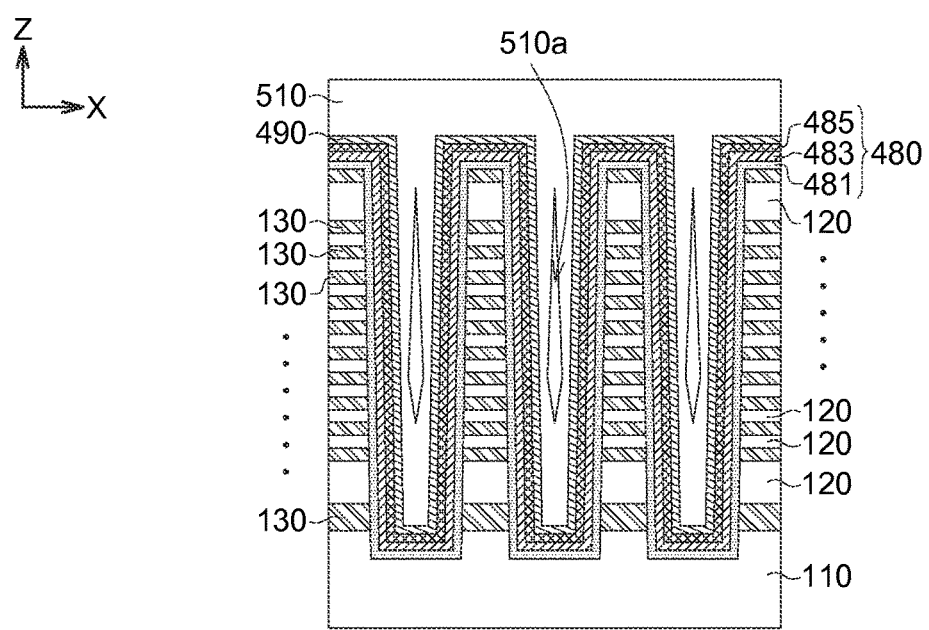

FIG. 5B is a cross-sectional view along the cross-sectional line 5B-5B' in FIG. 5A, and FIG. 5C is a cross-sectional view along the cross-sectional line 5C-5C' in FIG. 5A. As shown in FIGS. 5A-5C, an oxide material layer 510 is formed on the channel material layer 490 and filled in the recess 310, and the oxide material layer 510 has an air gap 510a therein.

Figure 6B:
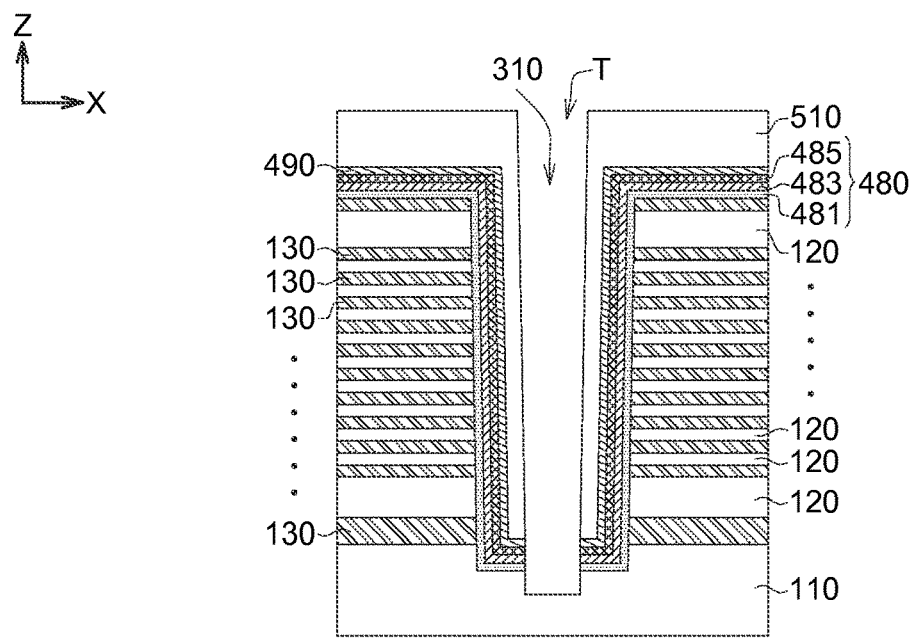
Figure 6C:
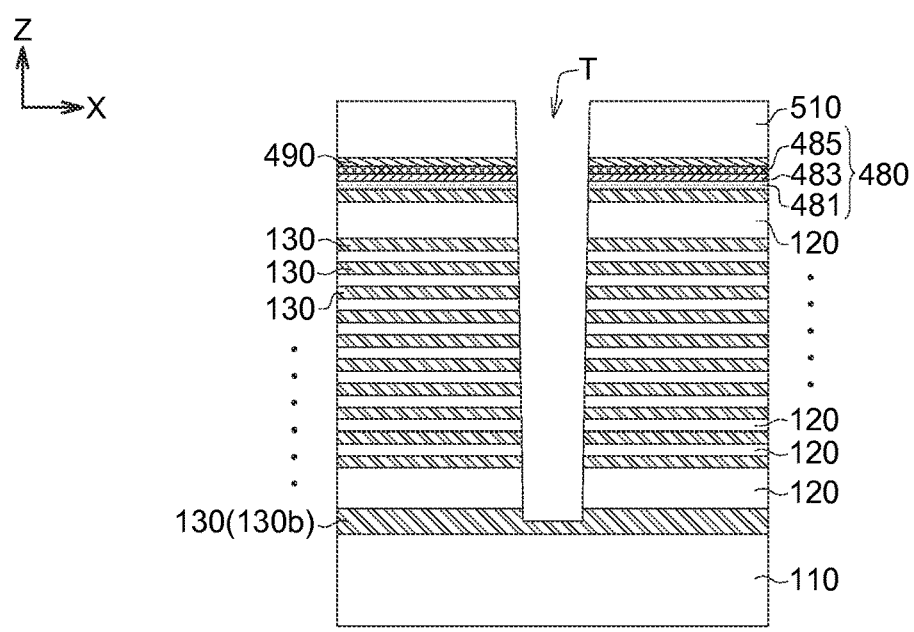
Figure 6D:
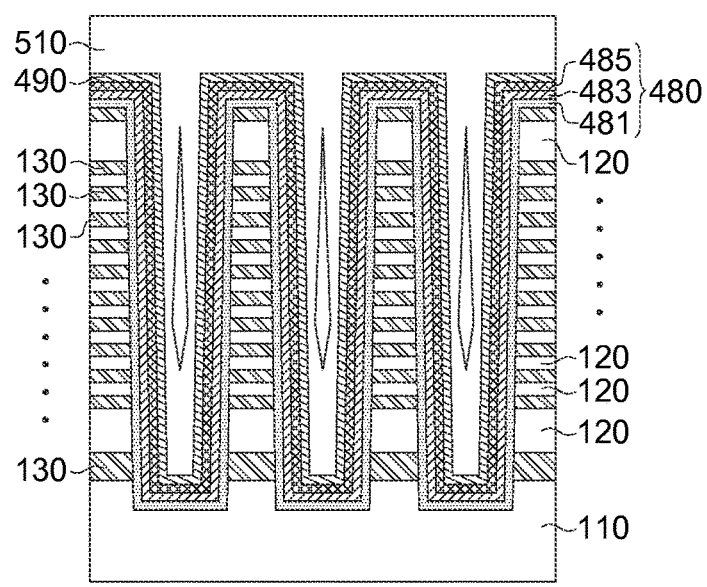

FIG. 6B is a cross-sectional view along the cross-sectional line 6B-6B' in FIG. 6A, FIG. 6C is a cross-sectional view along the cross-sectional line 6C-6C' in FIG. 6A, and FIG. 6D is a cross-sectional view along the cross-sectional line 6D-6D' in FIG. 6A. As shown in FIGS. 6A-6D, a portion of the conductive layers 120, a portion of the isolating layers 130, a portion of the memory structure material layer 480, a portion of the channel material layer 490, and a portion of the oxide material layer 510 along the short axis direction R1 of the elliptical cross-section are removed for forming a trench T.

As shown in FIGS. 6A-6C, the portion of the conductive layers 120, the portion of the isolating layers 130, the portion of the memory structure material layer 480, the portion of the channel material layer 490, and the portion of the oxide material layer 510 are removed by such as an etching process. After the etching process, as shown in FIG. 6B, the portion of the memory structure material layer 480, the portion of the channel material layer 490, and the portion of the oxide material layer 510 in the recess 310 are removed to expose the substrate 110. After the etching process, as shown in FIG. 6C, the portion of the conductive layers 120 and the portion of the isolating layers 130 outside the recess 310 are removed to expose a bottommost layer 130b of the isolating layers 130. In other words, due to the existence of the air gap 510a, the materials in the recess 310 are etched at a more rapid etching rate, resulting in a deeper etching depth, and the corresponding region of the trench T connects to the substrate 110. The materials outside the recess 310 without the air gap 510a therein are etched at a slower etching rate, resulting in a shallower etching depth, and the corresponding region of the trench T only reaches the bottommost layer 130b of the insulating layers 130 without contacting the substrate 110. As such, the memory structure layers 180 are formed.

The formation of the trench T allows the formation of the first vertical memory structures 140 and the second vertical memory structures 150 in the following steps, thereby the manufactured semiconductor structure may be provided with the effects and advantages aforementioned.

Figure 7A:
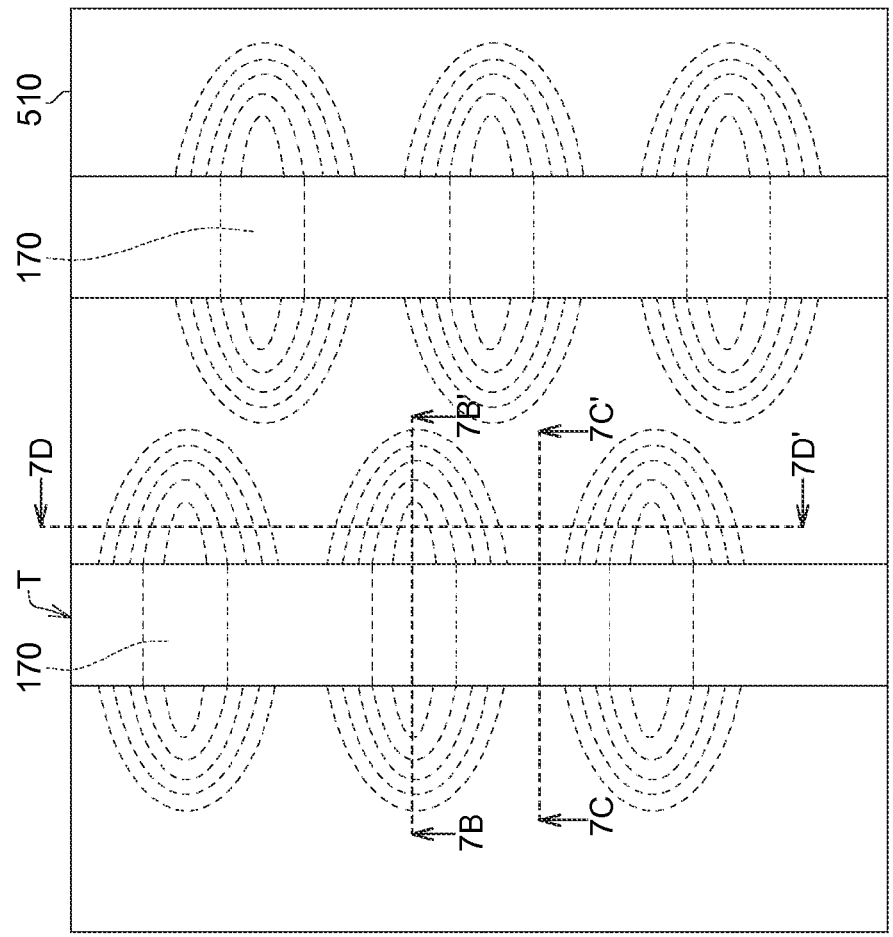
Figure 7B:
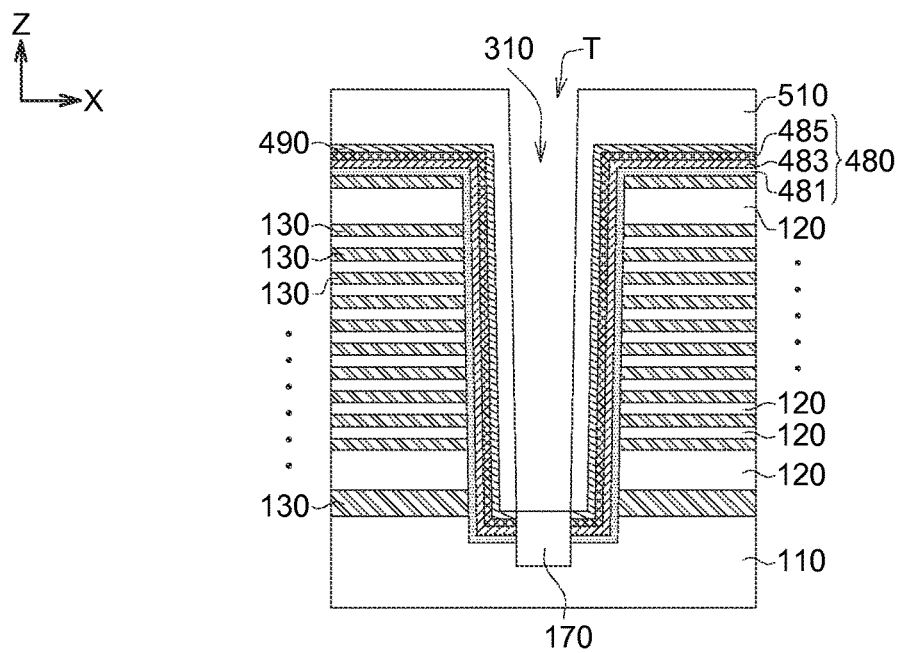
Figure 7C:
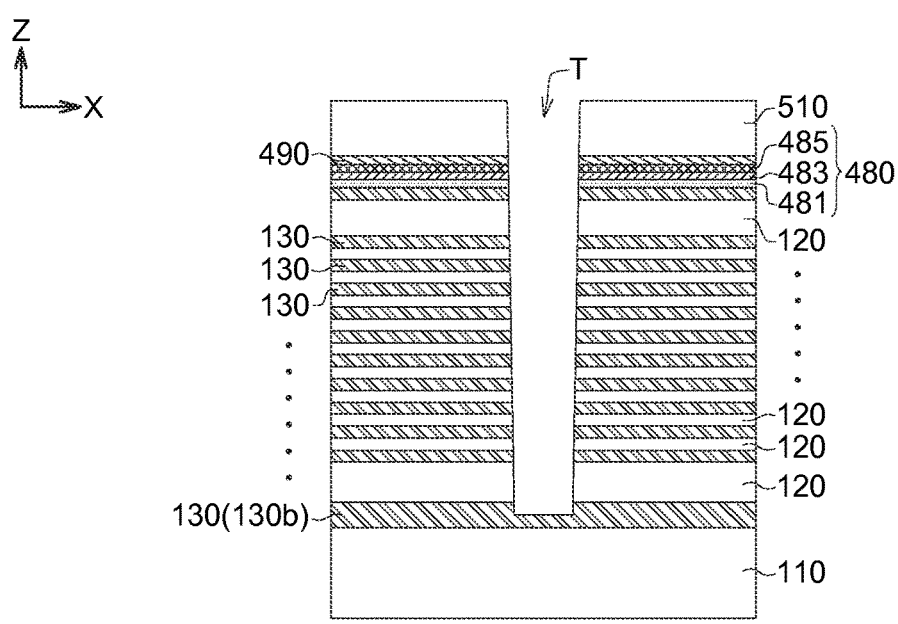
Figure 7D:
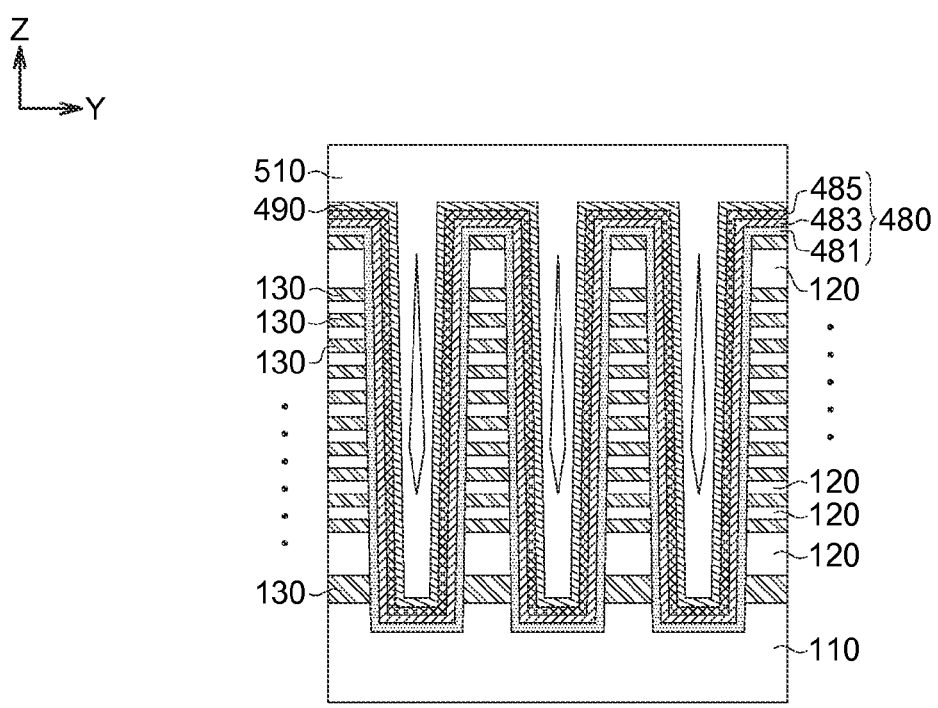

FIG. 7B is a cross-sectional view along the cross-sectional line 7B-7B' in FIG. 7A, FIG. 7C is a cross-sectional view along the cross-sectional line 7C-7C' in FIG. 7A, and FIG. 7D is a cross-sectional view along the cross-sectional line 7D-7D' in FIG. 7A. As shown in FIGS. 7A-7D, after the trench T is formed, the epitaxial structure 170 is formed on the substrate 110 in the recess 310. That is, the epitaxial structure 170 is formed between the isolation trench 160 and substrate 110.

In the embodiment, the epitaxial structure 170 is formed by a selective epitaxial growth (SEG) process, such that the region where the epitaxial structure 170 is grown is highly selective, that is, the epitaxial structure 170 is grown on a surface with crystal seeds. For example, the epitaxial structure 170 may be grown on the surface of the substrate 110 having single crystal silicon structure, rather than on other materials, e.g. an oxide layer or a polysilicon layer.

Figure 8A:
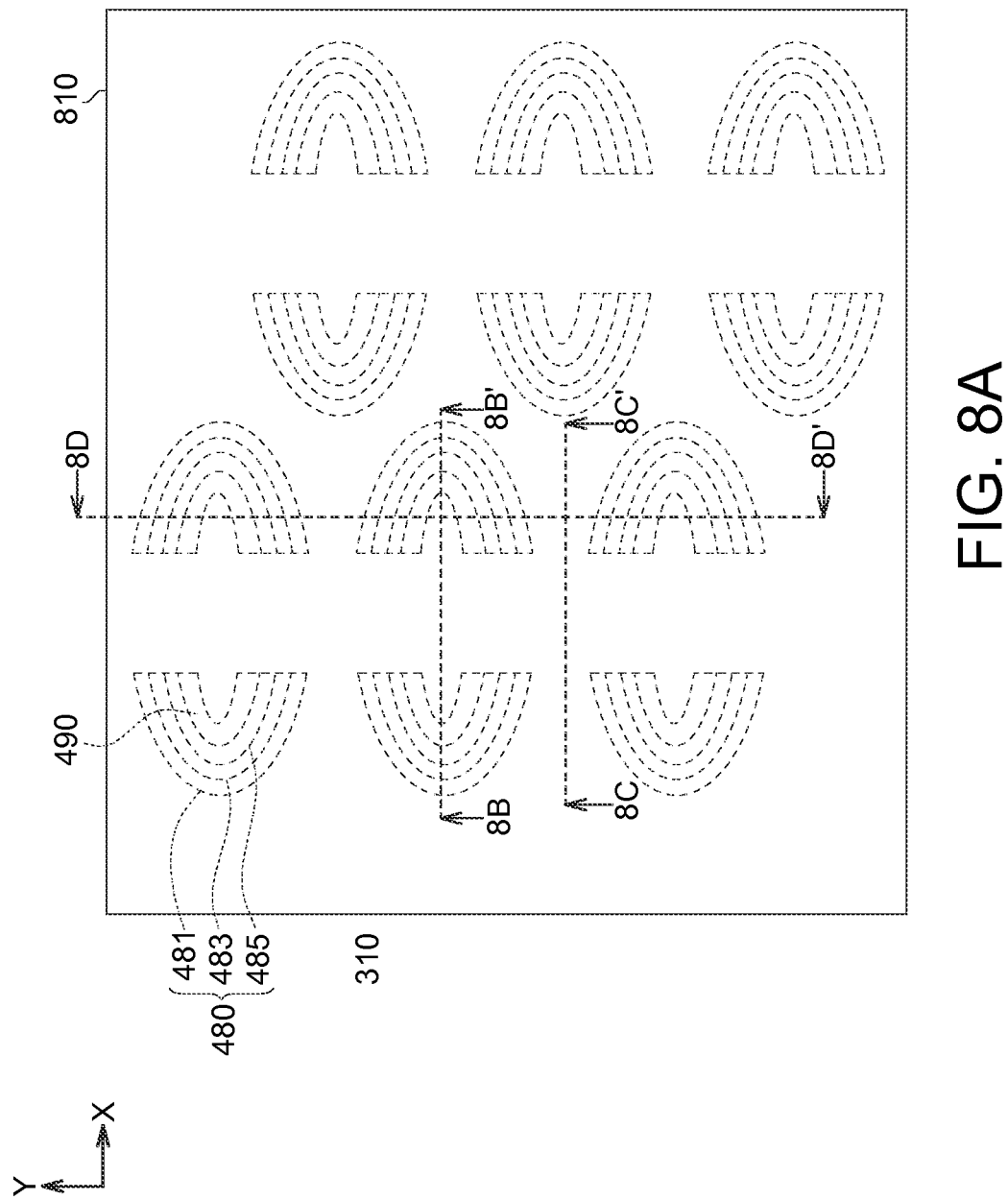
Figure 8B:
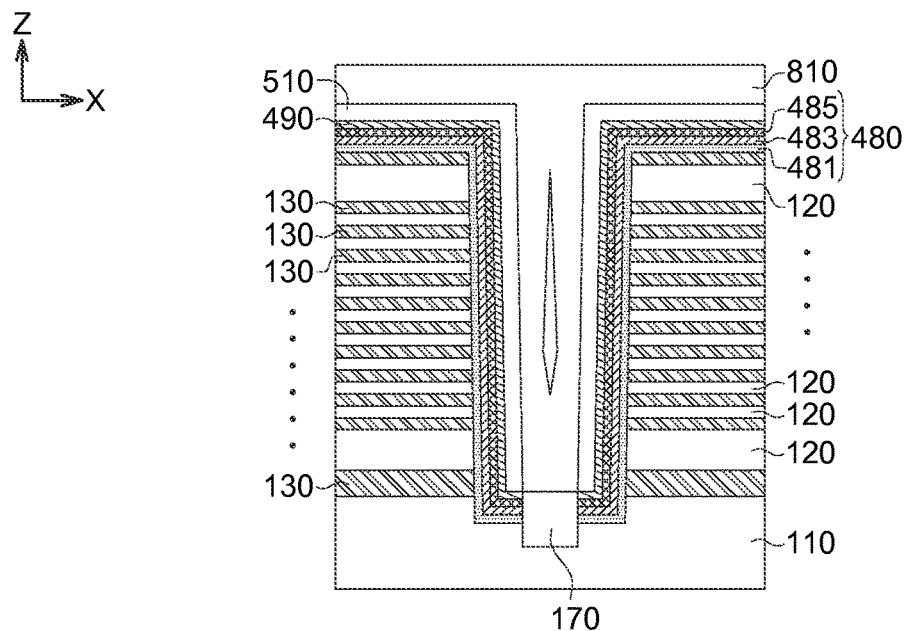
Figure 8C:
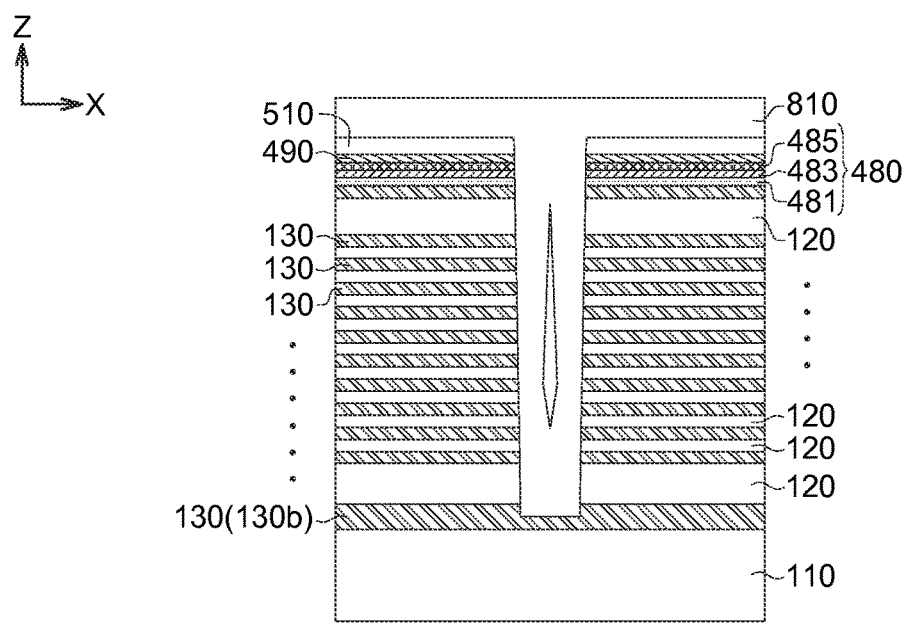
Figure 8D:
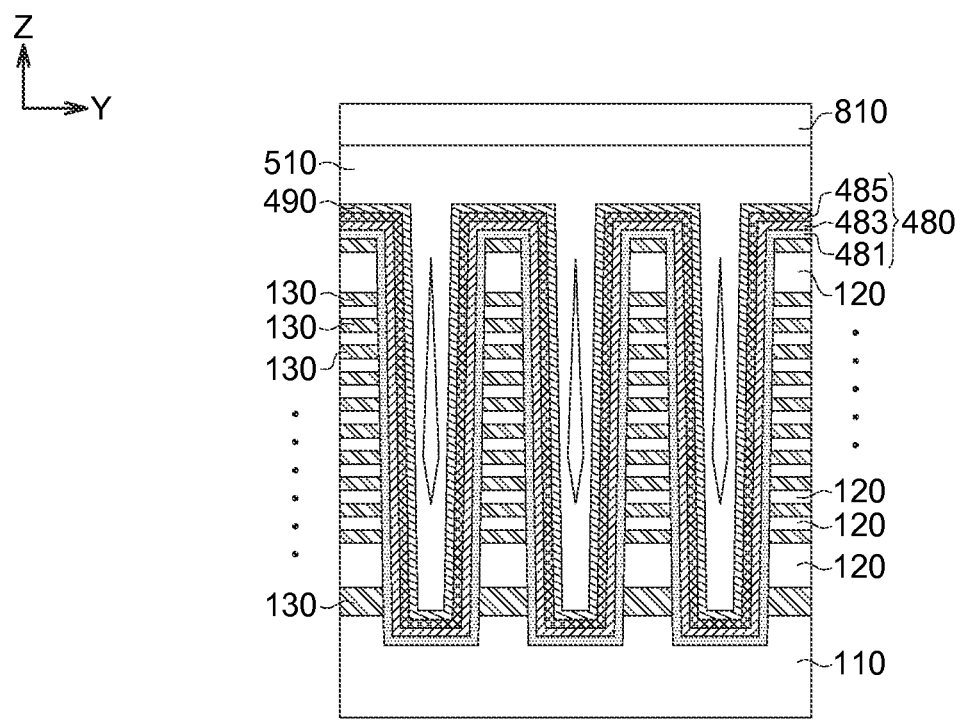

FIG. 8B is a cross-sectional view along the cross-sectional line 8B-8B' in FIG. 8A, FIG. 8C is a cross-sectional view along the cross-sectional line 8C-8C' in FIG. 8A, and FIG. 8D is a cross-sectional view along the cross-sectional line 8D-8D' in FIG. 8A. As shown in FIGS. 8A-8D, an isolating material 810 is filled in the trench T. As such, the isolation trench 160 is formed.

Figure 9A:
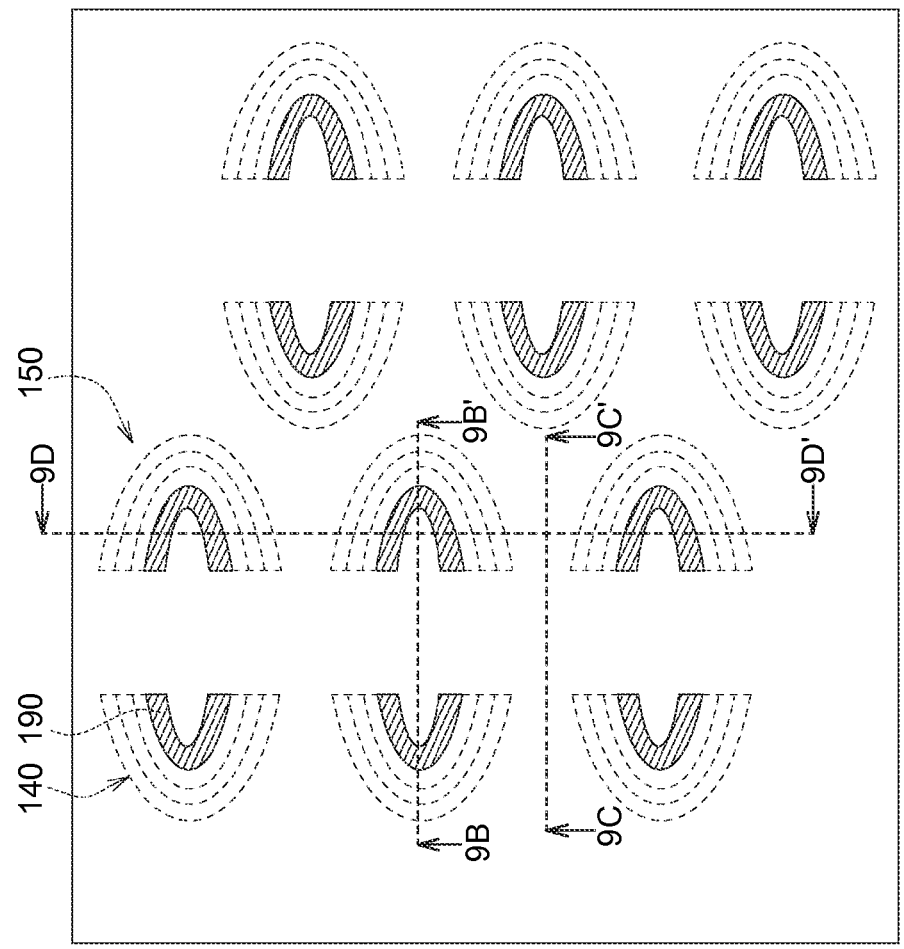
Figure 9B:
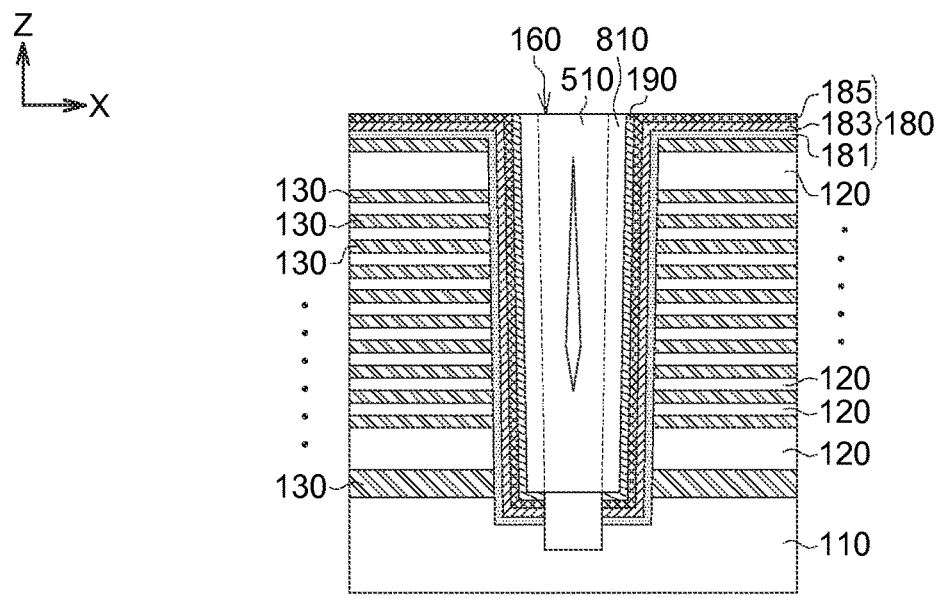
Figure 9C:
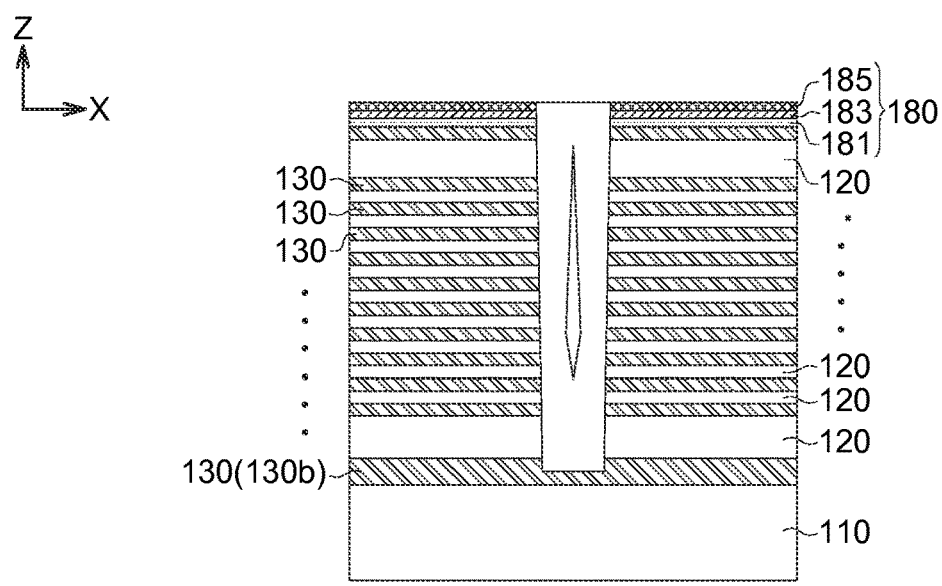
Figure 9D:
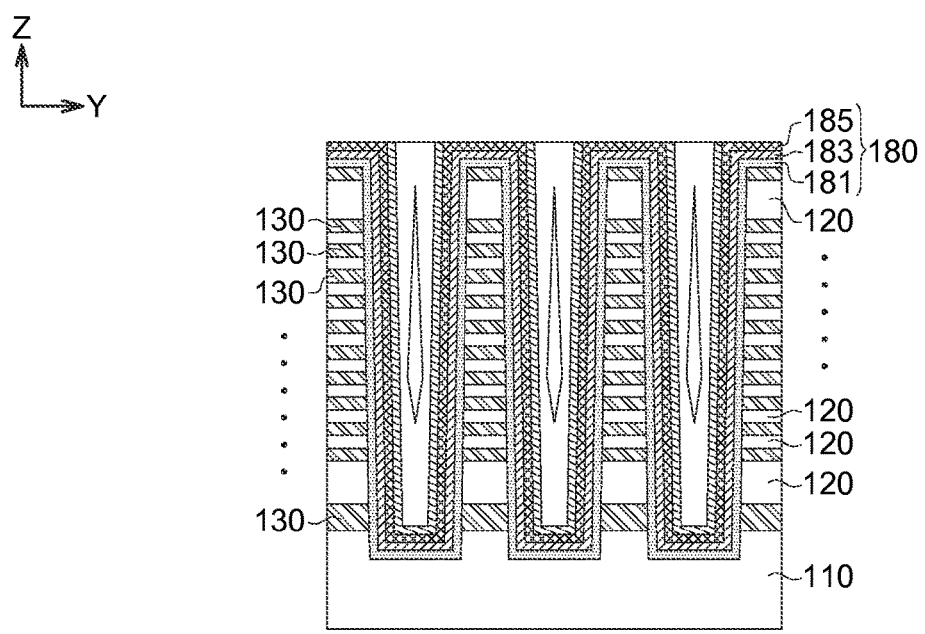

FIG. 9B is a cross-sectional view along the cross-sectional line 9B-9B' in FIG. 9A, FIG. 9C is a cross-sectional view along the cross-sectional line 9C-9C' in FIG. 9A, and FIG. 9D is a cross-sectional view along the cross-sectional line 9D-9D' in FIG. 9A. As shown in FIGS. 9A-9D, the channel material layer 490 exposed outside the trench T is removed by a chemical mechanical polishing (CMP) process for forming the channel layers 190.

As such, as shown in FIGS. 9A-9D, the first vertical memory structures 140 and the second vertical memory structures 150 are formed. The first vertical memory structures 140 and the second vertical memory structures 150 penetrate the conductive layers 120 and the insulating layers 130, the first vertical memory structures 140 have first horizontal C shaped cross-sections, and the second vertical memory structures 150 have second horizontal C shaped cross-sections.

Moreover, after the CMP process, the oxide material layer 510 and the isolating material 810 remained in the trench T form the isolation trench 160. The isolation trench 160 is formed on the substrate 110 and located between the first vertical memory structure 140 and the second vertical memory structure 150.

In addition, each of the channel layers 190 of the vertical memory structures are separated from one another along the Y direction, such that the epitaxial structures 170 are located between the isolation trench 160 and the substrate 110, and the first vertical memory structures 140 and the second vertical memory structures 150 are electrically connected to the substrate 110 via the epitaxial structures 170. Specifically speaking, the channel layers 190 of the first vertical memory structures 140 and the channel layers 190 of the second vertical memory structures 150 are electrically connected to the substrate 110 via the epitaxial structures 170.

Figure 10A:
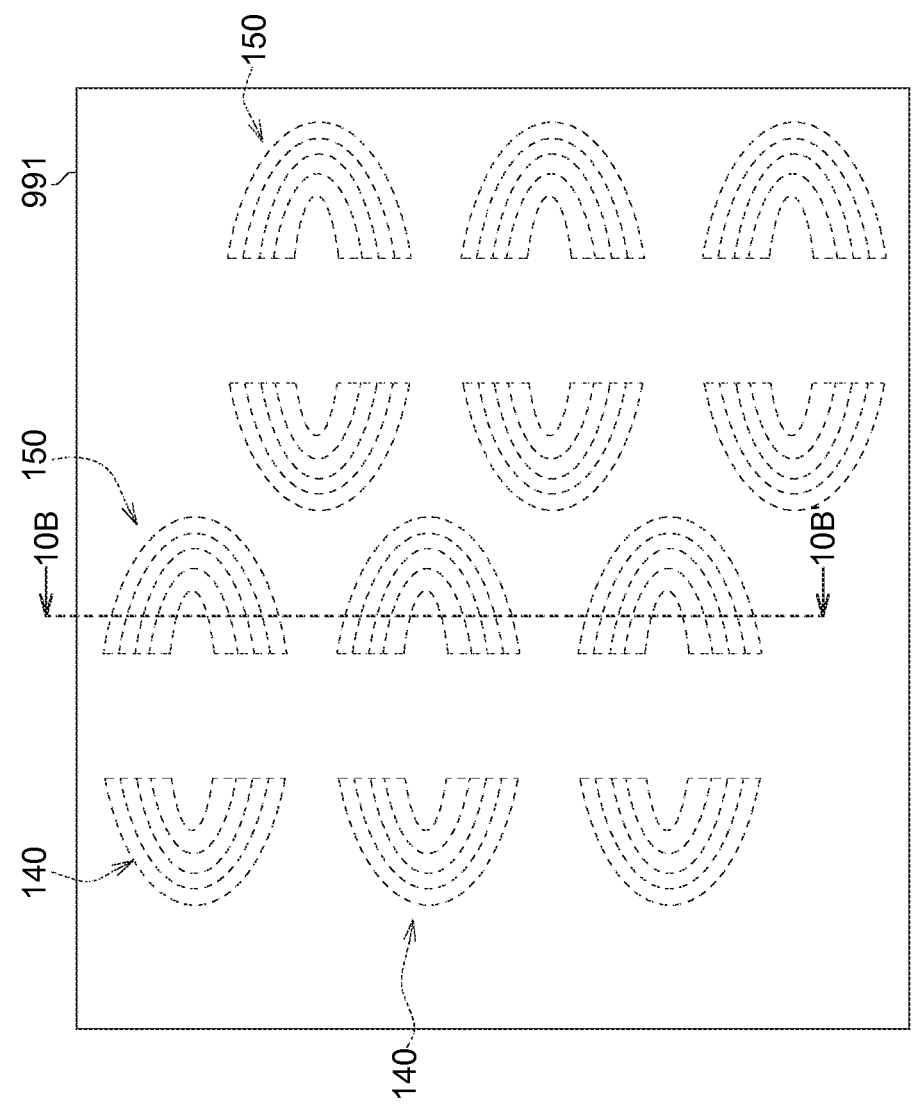
Figure 10B:
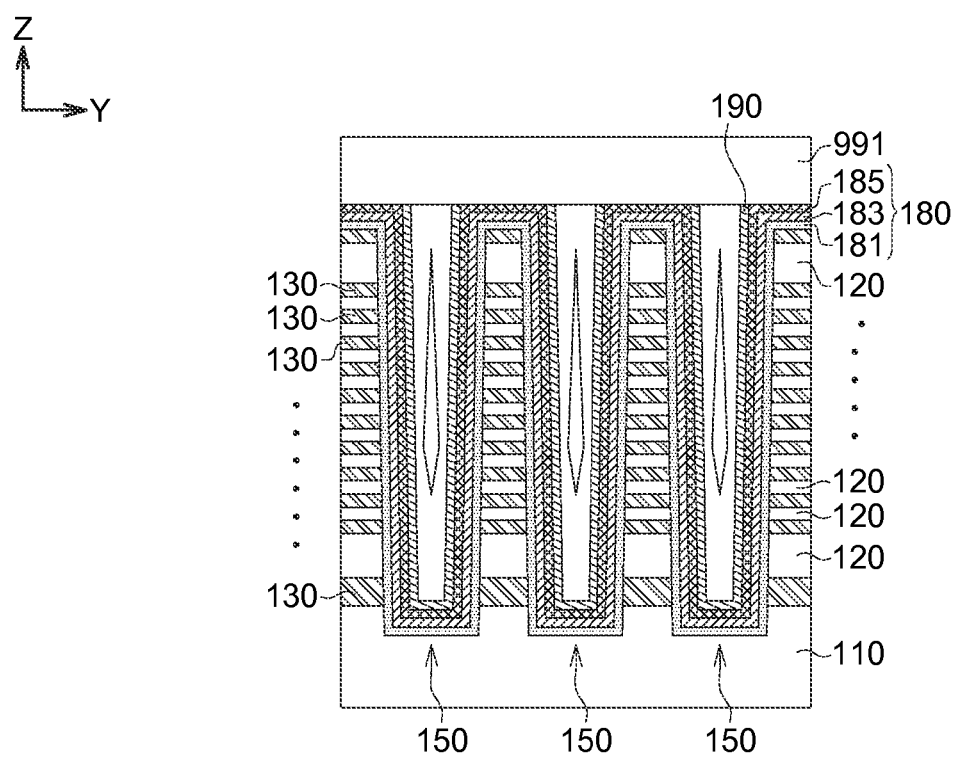

FIG. 10B is a cross-sectional view along the cross-sectional line 10B-10B' in FIG. 10A. As shown in FIGS. 10A-10B, an isolating material layer 991 is formed on the first vertical memory structures 140 and the second vertical memory structures 150.

Figure 11A:
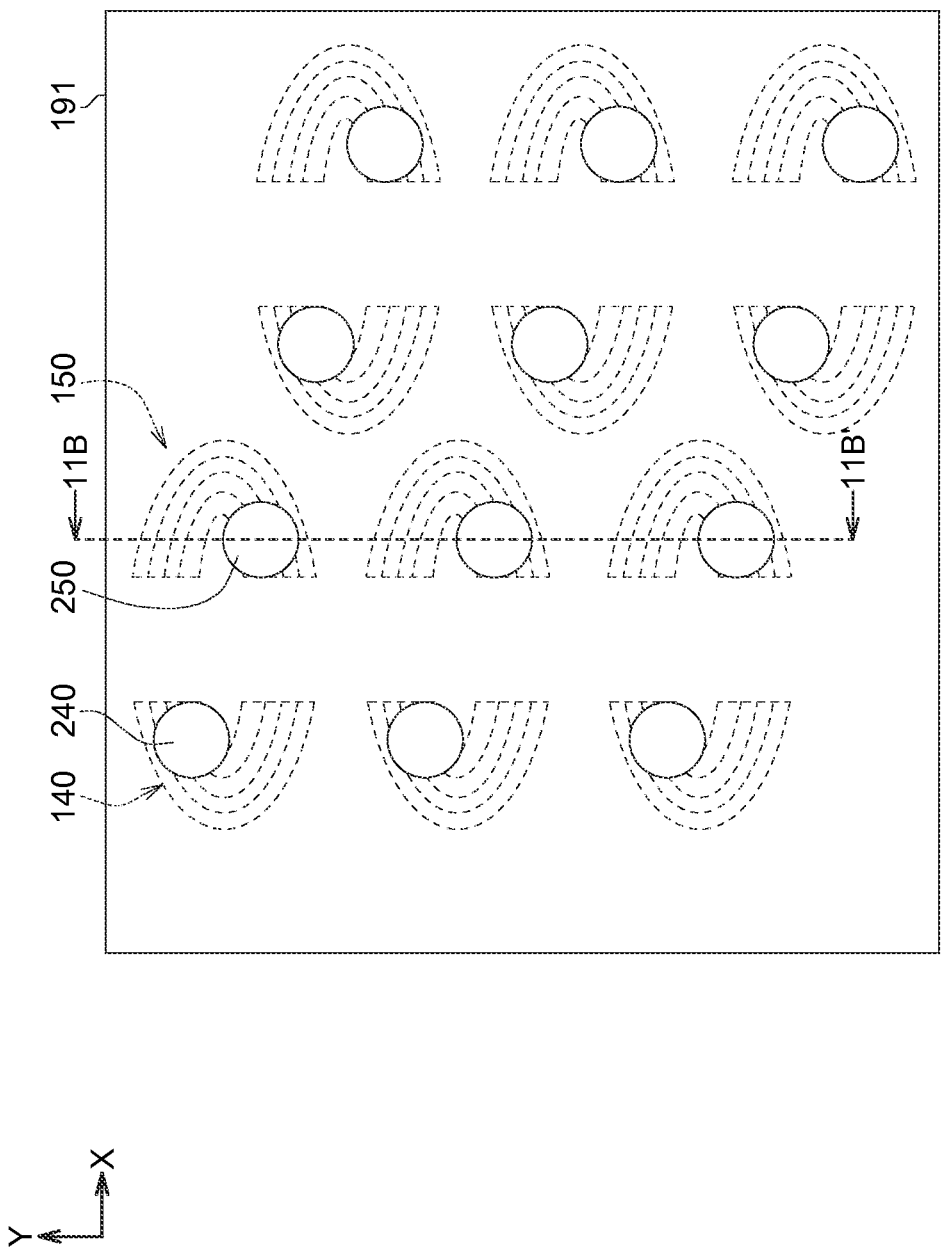
Figure 11B:
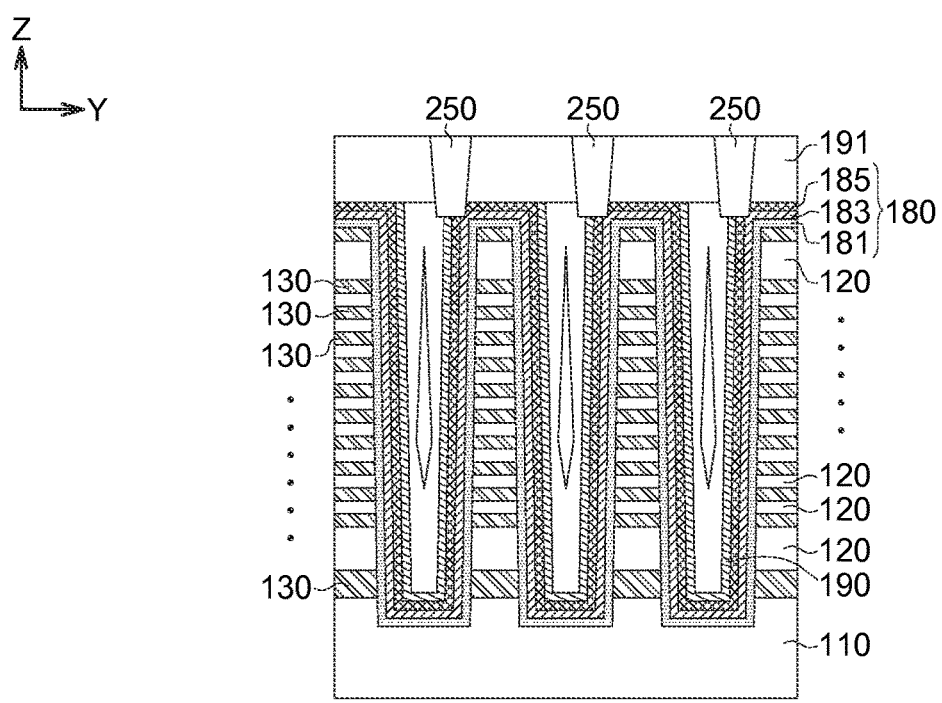

FIG. 11B is a cross-sectional view along the cross-sectional line 11B-11B' in FIG. 11A. As shown in FIGS. 11A-11B, a first contact structure 240 electrically connected to the first vertical memory structure 140 is formed, and a second contact structure 250 electrically connected to the second contact memory structure 150 is formed. In the embodiment, for example, contact holes are formed in the isolating material layer 991, and then a conductive material is filled into the contact holes for forming the first contact structure 240 and the second contact structure 250 in the isolation layer 191.

Next, referring to FIGS. 1A-1E, the isolation layer 193 is formed on the isolation layer 191, and the first bit line BL1 and the second bit line BL2 are formed in the isolation layer 193. The first bit line BL1 is electrically connected to the first contact structure 240, and the second bit line BL2 is electrically connected to the second contact structure 250. As such, the semiconductor structure 100 as shown in FIGS. 1A-1E is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor structure, comprising:
a substrate;
a plurality of conductive layers and a plurality of insulating layers formed on the substrate, wherein the conductive layers and the insulating layers are interlaced and stacked on the substrate;
a first vertical memory structure and a second vertical memory structure penetrating the conductive layers and the insulating layers and formed on the substrate, wherein the first vertical memory structure has a first horizontal C shaped cross-section, and the second vertical memory structure has a second horizontal C shaped cross-section, the first vertical memory structure and the second vertical memory structure respectively comprises a memory structure layer;
an isolation trench formed on the substrate and located between the first vertical memory structure and the second vertical memory structure;
an epitaxial structure formed between the first vertical memory structure and the second vertical memory structure, wherein the epitaxial structure has two sidewalls opposite to each other, the first vertical memory structure and the second vertical memory structure are separated from each other by the epitaxial structure, and the first vertical memory structure and the second vertical memory structure are in contact with the two sidewalls respectively; and
a channel layer formed on the memory structure layer, wherein the channel layer is located on the two sidewalls of the epitaxial structure and exposing a top surface of the epitaxial structure.

2. The semiconductor structure according to claim 1, wherein the first vertical memory structure and the second vertical memory structure are electrically connected to the substrate via the epitaxial structure.

3. The semiconductor structure according to claim 1, wherein
the memory structure layer comprises:
a blocking layer formed on the conductive layers;
a memory storage layer formed on the blocking layer; and
a tunneling layer formed on the memory storage layer.

4. The semiconductor structure according to claim 1, wherein the channel layer is a polysilicon layer.

5. The semiconductor structure according to claim 1, wherein a pattern of the first horizontal C shaped cross-section of the first vertical memory structure and a pattern of the second horizontal C shaped cross-section of the second vertical memory structure are bilaterally symmetric with respect to the isolation trench.

6. The semiconductor structure according to claim 1, further comprising:
a first contact structure electrically connected to the first vertical memory structure;
a second contact structure electrically connected to the second vertical memory structure;
a first bit line electrically connected to the first contact structure; and
a second bit line electrically connected to the second contact structure.

7. The semiconductor structure according to claim 1, wherein the first vertical memory structure and the second vertical memory structure are in direct contact with the isolation trench.

8. The semiconductor structure according to claim 1, wherein a width of the isolation trench is 40-50 nm, and the first vertical memory structure and the second vertical memory structure are separated from each other by the width of the isolation trench.

9. The semiconductor structure according to claim 1, wherein a width of the first horizontal C shaped cross-section and a width of the second horizontal C shaped cross-section are 50-80 nm.

10. A manufacturing method of a semiconductor structure, comprising:
   providing a substrate;
   forming a plurality of conductive layers and a plurality of insulating layers on the substrate, wherein the conductive layers and the insulating layers are interlaced and stacked on the substrate;
   forming a first vertical memory structure and a second vertical memory structure on the substrate, wherein the first vertical memory structure and the second vertical memory structure penetrate the conductive layers and the insulating layers, the first vertical memory structure has a first horizontal C shaped cross-section, and the second vertical memory structure has a second horizontal C shaped cross-section, the first vertical memory structure and the second vertical memory structure respectively comprises a memory structure layer;
   forming an isolation trench on the substrate and located between the first vertical memory structure and the second vertical memory structure;
   forming an epitaxial structure between the first vertical memory structure and the second vertical memory structure, wherein the epitaxial structure has two sidewalls opposite to each other, the first vertical memory structure and the second vertical memory structure are separated from each other by the epitaxial structure, and the first vertical memory structure and the second vertical memory structure are in contact with the two sidewalls respectively; and
   forming a channel layer on the memory structure layer, wherein the channel layer is located on the two sidewalls of the epitaxial structure and exposing a top surface of the epitaxial structure.

11. The manufacturing method of the semiconductor structure according to claim 10, wherein the first vertical memory structure and the second vertical memory structure are electrically connected to the substrate via the epitaxial structure.

12. The manufacturing method of the semiconductor structure according to claim 10, wherein forming the first vertical memory structure, the second vertical memory structure, and the isolation trench comprises:
   forming a recess which penetrates the conductive layers and the insulating layers and stops on the substrate, wherein the recess has an elliptical cross-section;
   forming a memory structure material layer in the recess;
   forming a channel material layer on the memory structure material layer;
   forming an oxide material layer on the channel material layer and filled in the recess, wherein the oxide material layer has an air gap therein;
   removing a portion of the conductive layers, a portion of the isolating layers, a portion of the memory structure material layer, a portion of the channel material layer, and a portion of the oxide material layer for forming a trench; and
   filling an isolating material in the trench for forming the isolation trench.

13. The manufacturing method of the semiconductor structure according to claim 12, wherein the portion of the conductive layers, the portion of the isolating layers, the portion of the memory structure material layer, the portion of the channel material layer, and the portion of the oxide material layer are removed by an etching process, the portion of the memory structure material layer, the portion of the channel material layer, and the portion of the oxide material layer in the recess are removed to expose the substrate, and the portion of the conductive layers and the portion of the isolating layers are removed to expose a bottommost layer of the isolating layers.

14. The manufacturing method of the semiconductor structure according to claim 12, further comprising:
   forming an epitaxial structure between the isolation trench and substrate after forming the trench.

15. The manufacturing method of the semiconductor structure according to claim 12, further comprising:
   removing the channel material layer exposed outside the trench by a chemical mechanical polishing (CMP) process.

16. The manufacturing method of the semiconductor structure according to claim 10, further comprising:
   forming a first contact structure electrically connected to the first vertical memory structure;
   forming a second contact structure electrically connected to the second vertical memory structure;
   forming a first bit line electrically connected to the first contact structure; and
   forming a second bit line electrically connected to the second contact structure.

* * * * *